(12) United States Patent
Li et al.

(10) Patent No.: US 12,211,884 B2
(45) Date of Patent: Jan. 28, 2025

(54) MICRO-LED DISPLAY DEVICE

(71) Applicant: PlayNitride Display Co., Ltd., Miaoli County (TW)

(72) Inventors: Yun-Li Li, Miaoli County (TW); Kuan-Yung Liao, Miaoli County (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 492 days.

(21) Appl. No.: 17/728,212

(22) Filed: Apr. 25, 2022

(65) Prior Publication Data

US 2022/0415964 A1    Dec. 29, 2022

Related U.S. Application Data

(60) Provisional application No. 63/215,996, filed on Jun. 29, 2021.

(30) Foreign Application Priority Data

Aug. 23, 2021   (TW) .................................. 110131126

(51) Int. Cl.
   *H01L 27/15*       (2006.01)
   *G09G 3/32*        (2016.01)
   *H01L 33/62*       (2010.01)

(52) U.S. Cl.
   CPC .............. *H01L 27/156* (2013.01); *G09G 3/32* (2013.01); *H01L 33/62* (2013.01); *G09G 2320/0626* (2013.01)

(58) Field of Classification Search
   CPC ... H01L 27/156; H01L 33/62; H01L 25/0753; G09G 3/32
   See application file for complete search history.

(56) References Cited

U.S. PATENT DOCUMENTS 8,928,688 B2 *   1/2015   Hung .................. G09G 3/2051
                                                   345/596
2006/0001617 A1   1/2006   Shin et al.
                    (Continued)

FOREIGN PATENT DOCUMENTS

CN        105074808 A     11/2015
CN        106297672 A      1/2017
                (Continued)

OTHER PUBLICATIONS

Search Report with English Translation of CN Application No. 2021109663128 filed Aug. 23, 2021.

*Primary Examiner* — Thao P Le
(74) *Attorney, Agent, or Firm* — Muncy, Geissler, Olds & Lowe, P.C.

(57) ABSTRACT

A micro-LED display device mainly has a plurality of pixel areas arranged in matrix and a driving circuit. Each pixel area has a plurality of sub-pixel areas arranged adjacent to each other. In a first driving mode, the driving circuit enables the rows of pixel areas in sequence. When one of rows of pixel areas is enabled, the driving circuit controls one sub-pixel area of each pixel area on the enabled row of pixel areas to display an image color. In a second driving mode, the rows of pixel areas are also enabled in sequence. When one of rows of pixel area is enabled, the driving circuit drives all sub-pixel areas of each pixel area on the enabled row of pixel area to synchronously display the same image color. Therefore, a high-brightness requirement is met, and the overall power consumption is not increased.

12 Claims, 10 Drawing Sheets

(56) References Cited

U.S. PATENT DOCUMENTS

| | | | |
|---|---|---|---|
| 2017/0069290 A1* | 3/2017 | Lee | G09G 3/2003 |
| 2018/0047876 A1* | 2/2018 | Chu | H01L 27/156 |
| 2019/0204671 A1* | 7/2019 | Lee | G02F 1/134336 |
| 2021/0065625 A1* | 3/2021 | Wang | G09G 3/3233 |
| 2021/0183299 A1* | 6/2021 | Park | G09G 3/2074 |
| 2021/0366343 A1* | 11/2021 | Oh | G09G 3/3291 |

FOREIGN PATENT DOCUMENTS

| | | |
|---|---|---|
| CN | 106531110 A | 3/2017 |
| CN | 206003477 U | 3/2017 |
| CN | 106875890 A | 6/2017 |
| CN | 107274822 A | 10/2017 |
| CN | 108257516 A | 7/2018 |
| CN | 108630146 A | 10/2018 |
| TW | 201911562 A | 3/2019 |

\* cited by examiner

MICRO-LED DISPLAY DEVICE

CROSS-REFERENCE TO RELATED APPLICATIONS

This application claims the benefit of United States provisional application filed on Jun. 29, 2021 and having application Ser. No. 63/215,996, the entire contents of which are hereby incorporated herein by reference.

This application is based upon and claims priority under 35 U.S.C. 119 from Taiwan Patent Application No. 110131126 filed on Aug. 23, 2021, which is hereby specifically incorporated herein by this reference thereto.

BACKGROUND OF THE INVENTION

1. Field of the Invention

The present invention is related to a self-luminous display device, and more particularly to a micro-LED display device.

2. Description of the Prior Arts

A general self-luminous display device (such as OLED, LED) includes a display area and a non-display area. The non-display area has a driving circuit. The display area has a plurality of pixel areas arranged in a matrix, a plurality of scan lines and a plurality of data lines. Each pixel area has three sub-pixels. The three sub-pixels are three different colored-light (red, green and bule) light-emitting elements. To display an image, each of the light-emitting elements is controlled by the corresponding scan line and the corresponding data lines. In more detail, the driving circuit on the non-display area is electrically connected to the data lines and outputs different image signals according to a pixel data of the image to the sub-pixels of the corresponding pixel area through the data lines. That is, the driving circuit may control the conduction current of each light-emitting element to determine the light emitted by the light-emitting element. To meet the high-brightness requirement of the self-luminous display device, the voltage supplied to the light-emitting element is increased to increase its conduction current according to the voltage and current characteristic curve of the light-emitting element. Therefore, the brightness of the self-luminous display device is relatively increased. However, the increased conduction current generates an excessive drive circuit load and increase overall power consumption.

To overcome the shortcomings, the present invention provides a micro-LED display device to mitigate or to obviate the aforementioned problems.

SUMMARY OF THE INVENTION

The objective of the present invention provides a micro-LED display device.

To achieve the foregoing objective, the micro-LED display device has:
- a plurality of pixel areas arranged in N*M matrix to constitute N rows of pixel areas and M columns of pixel areas, wherein each pixel area has K sub-pixel areas arranged adjacent to each other and each sub-pixel area has J micro-LEDs with different colored lights; and
- a driving circuit electrically connected to each pixel area and having a first driving mode and a second driving mode, wherein
- in the first driving mode, the driving circuit sequentially enables the N rows of pixel areas, and when one of the rows of pixel areas is enabled, the at least one sub-pixel area of each pixel area on the enabled row of pixel areas is driven to display an image color; and
- in the second driving mode, the driving circuit sequentially enables the N rows of pixel areas, and when one of the rows of pixel areas is enabled, the K sub-pixel areas of each pixel area on the enabled row of pixel areas are driven to display the same image colors.

Based on the foregoing description, the present invention mainly provides the second driving mode of the driving circuit. In the second driving mode, the K sub-pixel areas of each pixel area on the row of pixel area are driven to display the same image colors when the row of pixel area is enabled. Compared to the first driving mode, the image color is displayed by one of the sub-pixel areas of each pixel area in the first driving mode, so the brightness of the present invention in the second mode is relatively and greatly increased to meet the high-brightness requirement. Therefore, the present invention meets the high-brightness requirement without increasing the conduction currents and the overall power consumption is not increased.

To achieve the foregoing objective, another micro-LED display device has:
- a plurality of pixel groups arranged in N*M matrix to constitute N rows of pixel groups and M columns of pixel groups, wherein each pixel group has K pixel areas arranged adjacent to each other and each pixel area has J micro-LEDs with different colored lights; and
- a driving circuit electrically connected to each pixel group and having a first driving mode and a second driving mode, wherein
- in the first driving mode, the driving circuit sequentially outputs N*K scanning signals to N*K rows of pixel pixels to sequentially enable the N*K rows of pixel areas, and outputs an image data signal to each enabled pixel area to display an image color; and
- in the second driving mode, the driving circuit sequentially enables the N rows of pixel groups, and when one of the rows of pixel groups is enabled, the image signal is outputted to the K pixel areas of each pixel group on the enabled row of pixel groups to display the same image colors.

Based on the foregoing description, the present invention mainly provides the second driving mode of the driving circuit. In the second driving mode, the K pixel areas of each enabled pixel group on the row of pixel groups are driven to display the same image colors when the row of pixel groups is enabled. Compared to the first driving mode, each pixel area is driven to display one specific image color in the first driving mode, so the brightness of the image displayed in the second mode is relatively and significantly increased to meet the high-brightness requirement. Therefore, the present invention meets the high-brightness requirement without increasing the conduction currents and the overall power consumption is not increased.

Other objectives, advantages and novel features of the invention will become more apparent from the following detailed description when taken in conjunction with the accompanying drawings.

DETAILED DESCRIPTION OF THE EMBODIMENTS

The present invention provides a micro-LED display device. With embodiments and drawings thereof, the features of the present invention are described in detail as follows.

Figure 1:
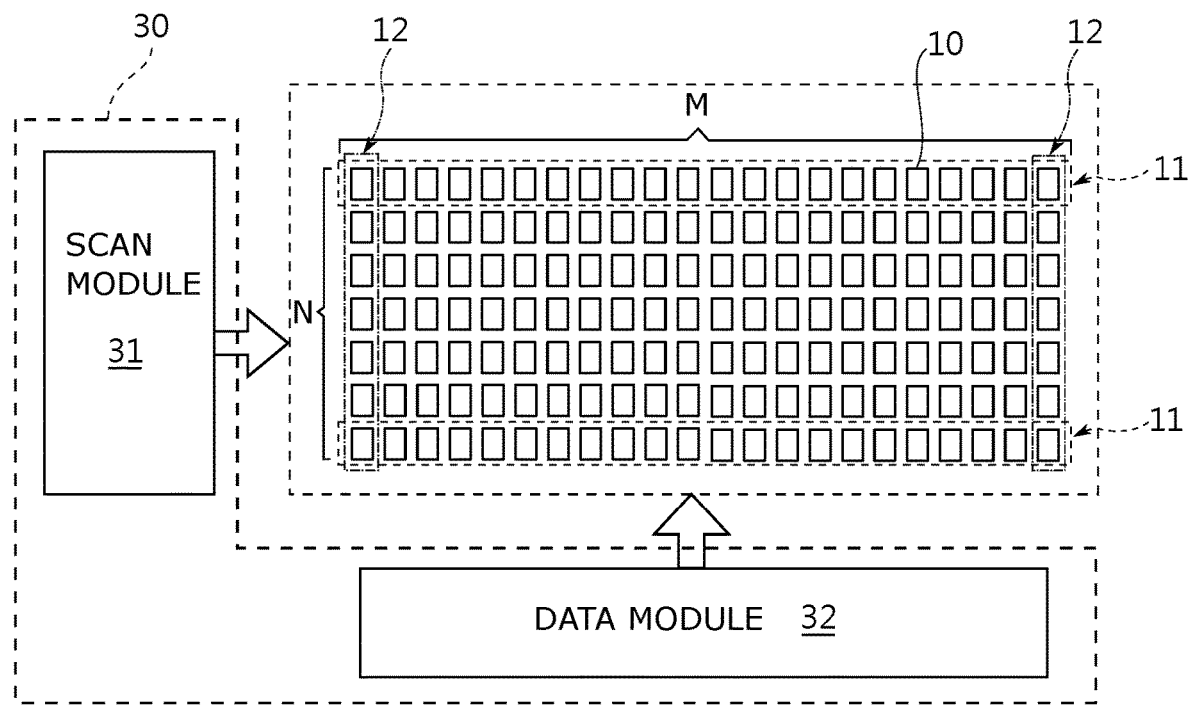
FIG. 1 is a schematic structural view of a first embodiment of a micro-LED display device in accordance with the present invention.
Figure 2A:
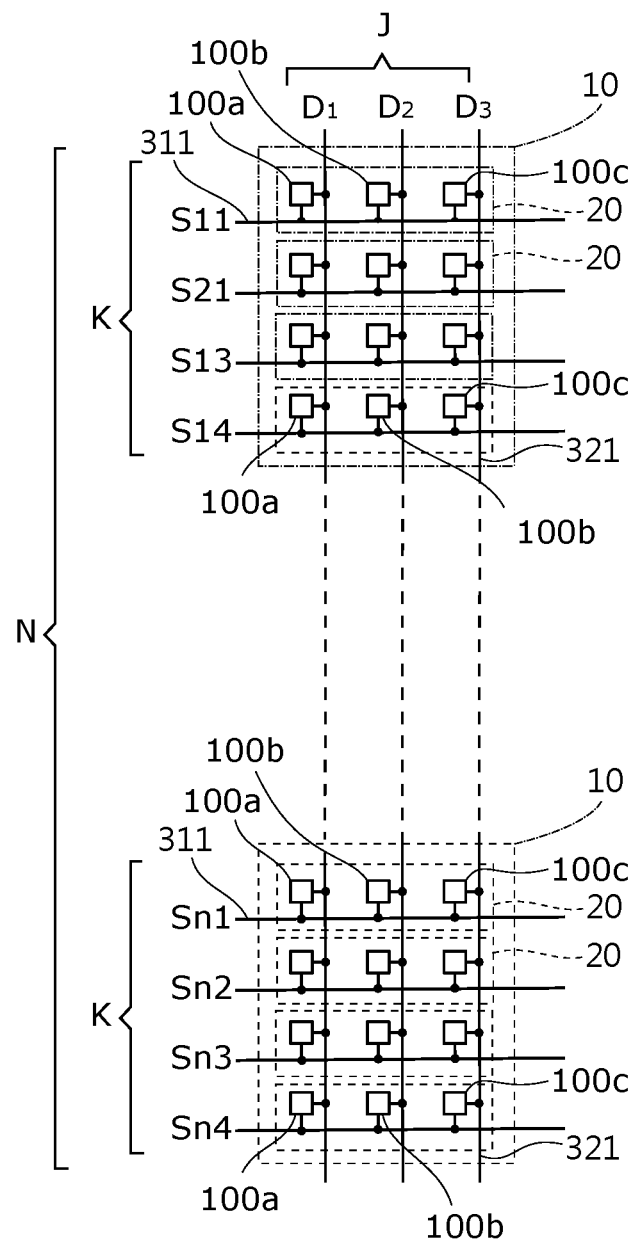
FIG. 2A is a schematic circuit diagram of a single pixel area of the micro-LED display device in accordance with the present invention.

With reference to FIGS. 1 and 2A, a first embodiment of a micro-LED display device of the present invention is shown, and the micro-LED display device has a plurality of pixel areas 10 and a driving circuit 30. The driving circuit 30 is electrically connected to the pixel areas 10 to drive the pixel areas 10.

Figure 7A:
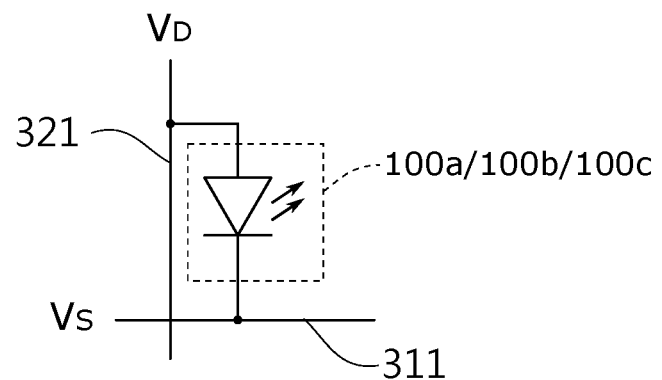
FIG. 7A is an equivalent circuit of a micro-LED of the micro-LED display device in accordance with the present invention.
Figure 7B:
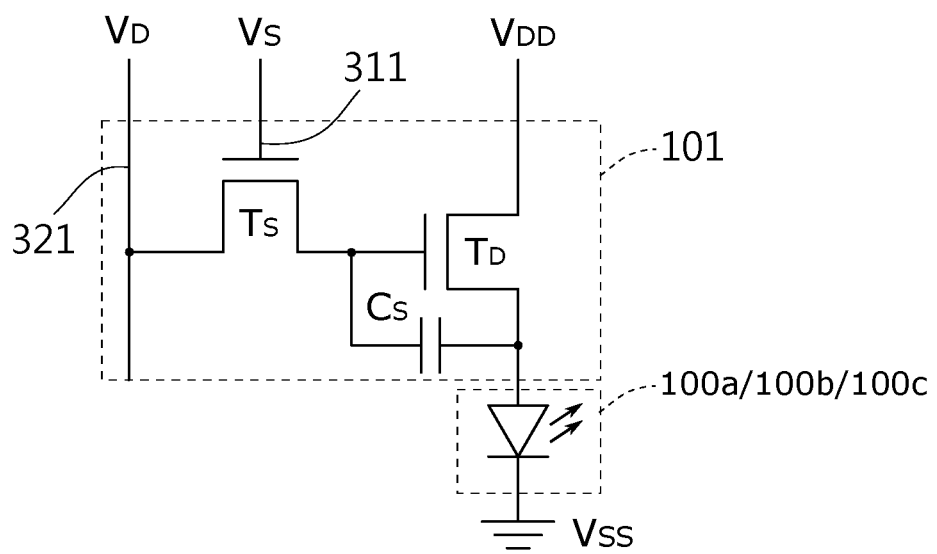
FIG. 7B is another equivalent circuit of a micro-LED of the micro-LED display device in accordance with the present invention.

The pixel areas 10 are arranged in a N*M matrix to constitute N rows of pixel areas 11 and M columns of pixel areas 12. Each pixel area 10 has K sub-pixel areas 20 arranged adjacent to each other. Each sub-pixel area 20 has J micro-LEDs 100a, 100b, 100c with different colored lights for, so each sub-pixel area 20 may display different image colors. In the present embodiment, a pitch between two adjacent pixel areas 10 is less than 100 μm and a size of each micro-LED 100a, 100b, 100c is less than 30 μm. With reference to FIG. 2A, each pixel area 10 in the first embodiment of the present invention has four sub-pixel areas 20 (K=4). Each sub-pixel area 20 has three different colored-light micro-LED 100a, 100b, 100c (J=3) and is electrically connected to a scan line 311. The micro-LEDs with the same colored light of each pixel area 10 are commonly and electrically connected to one data line 321. In particular, each sub-pixel area 20 at least has a red micro-LED 100a, a green micro-LED 100b and bule micro-LED 100c. In the present embodiment, the micro-LEDs 100a, 100b, 100c of each pixel area 10 are also arranged in a K*J matrix. The micro-LEDs on the same row are electrically connected to the same scan line 311 and the micro-LEDs on the same column are electrically connected to the same data line 321. Therefore, each pixel area 10 of the present embodiment has four scan lines 311 and three data lines 321. With reference to FIG. 7A, two electrodes of each micro-LED 100a, 100b, 100c are directly and electrically connected to the corresponding scan line 311 ($V_S$) and data line 321 ($V_D$). With reference to FIG. 7B, one electrode of each micro-LED 100a, 100b, 100c is electrically connected to the corresponding scan line 311, the corresponding data line 321 and a first voltage terminal (high voltage terminal $V_{DD}$) of a system power through a pixel driving circuit 101. The other electrode of each micro-LED 100a, 100b, 100c is electrically connected to a second voltage terminal (low voltage terminal $V_{SS}$) of the system power. The pixel driving circuit 101 may be a 2T1C driver consisted of two transistors $T_D$, $T_S$ and a storage capacitor $C_S$, 3T1C driver, 6T2C driver or the like.

The driving circuit 30 has a scan module 31 and a data module 32. With reference to FIG. 2A, the scan module 31 is electrically connected to the K scan lines of each row of pixel areas 11 and the data module 32 is electrically connected to the at least three data lines 321 of each column of pixel areas 12. The driving circuit 30 has a first driving mode and a second driving mode.

Figure 2B:
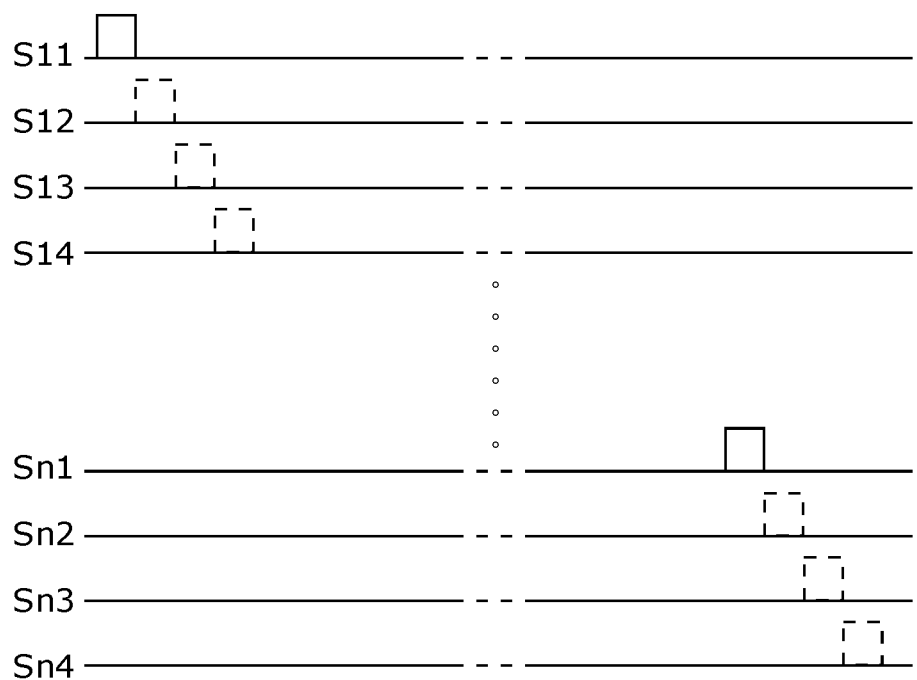
FIG. 2B is a time sequence diagram of a plurality scanning signals of FIG. 2A in a first driving mode.

In the first driving mode, with further reference to FIG. 2B, the driving circuit 30 sequentially enables the N rows of pixel areas 11 in one frame period through the scan module 31. When the driving circuit 30 enables one of the rows of pixel areas 11, the scan module 31 selects one of the sub-pixel areas 20 of each pixel area 10 on the row of pixel areas 11 and outputs a scanning signal S11~Sn1 to the selected sub-pixel area 20 to enable the sub-pixel area 20. In addition, more than one but less than K sub-pixel areas 20 may be selected to be enabled. The data module 32 outputs an image data signal to each of the enabled sub-pixel areas 20 and the each of the enable sub-pixel areas 20 displays an image color corresponding the image data signal. In the present embodiment, since each pixel area 10 has the K sub-pixel areas 20, the driving circuit 30 sequentially outputs N scanning signals in one frame period if the driving circuit 30 selects only one of the rows of pixel areas 11 to enable. At the time, the driving circuit 30 outputs the M*N image data signals to the enabled sub-pixel areas 20 through the data module 32.

Furthermore, the present embodiment of the micro-LED display device may further increase a resolution of an image displayed in the first driving mode. That is, the N*M pixels areas 10 of the micro-LED display device is increased to (N*K)*M sub-pixel areas 20 and a more detailed image is displayed. For example, to increase the resolution of the displayed image, in one frame period, the N rows of pixel areas 11 are sequentially enabled. That is, the scan module 31 sequentially outputs the scanning signals to the four scan lines 311 (K=4), and the four sub-pixel areas 20 in the pixel area 10 are enabled in sequence. Therefore, in one frame period, the driving circuit 30 sequentially outputs the N*K scanning signals. After then, the driving circuit 30 outputs M*N*K image data signals to the enabled sub-pixel areas 20 through the data module 32 to display an image with (N*K)*M image pixels.

Figure 2C:
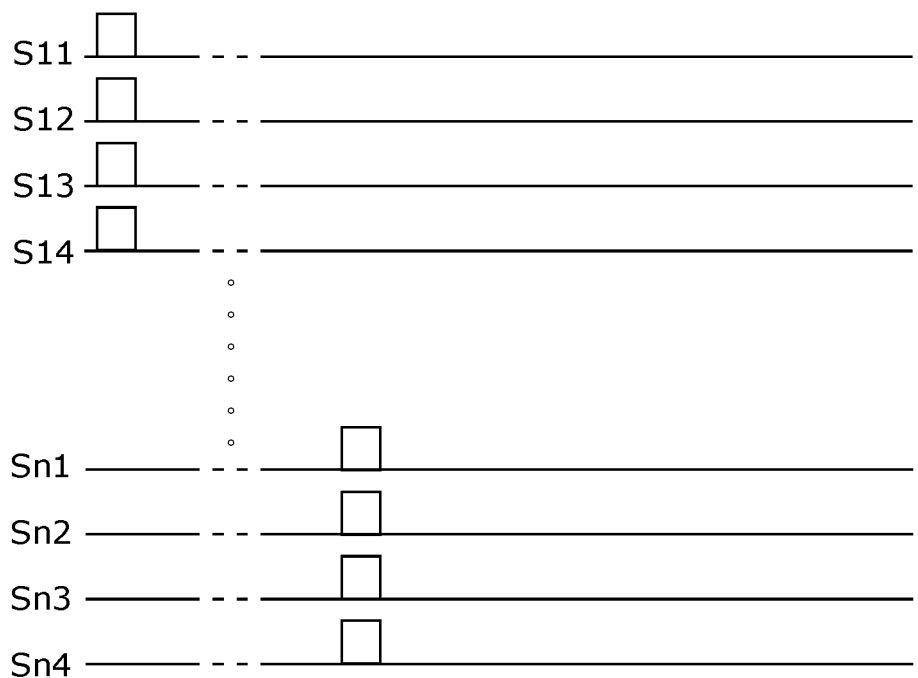
FIG. 2C is a time sequence diagram of a plurality scanning signals of FIG. 2A in a second driving mode.

In the second mode, with further reference to FIG. 2C, the driving circuit 30 sequentially enables the N rows of pixel areas 11 through the scan module 31. When the driving circuit 30 enables one of the rows of pixel areas 11, the scan module 31 synchronously outputs the four scanning signals S1~S4 to the K scan lines 311 of the K sub-pixel areas 20 of each pixel area 10 on the row of pixel areas 11. After then, the same image data signal is synchronously outputted to the enabled sub-pixel areas 20 in the same pixel area 10 to display the same image colors. That is, the K sub-pixel areas 20 of each pixel area 10 receive the same image data signals. In the second driving mode, a brightness of each pixel area 10 is increased by K times without increasing the driving current load.

In the first and second driving modes, the image data signal outputted from the data module 32 has at least three (j=3) constant-current signals or three variable current signals in one sub-pixel area 20. When the enabled sub-pixel area 20 receives the image data signal, the at least three micro-LED 100a, 100b, 100c with different colored lights respectively emits the preset grayscale colors and the three grayscale colors are mixed to the image color corresponding the image data signal.

Figure 3:
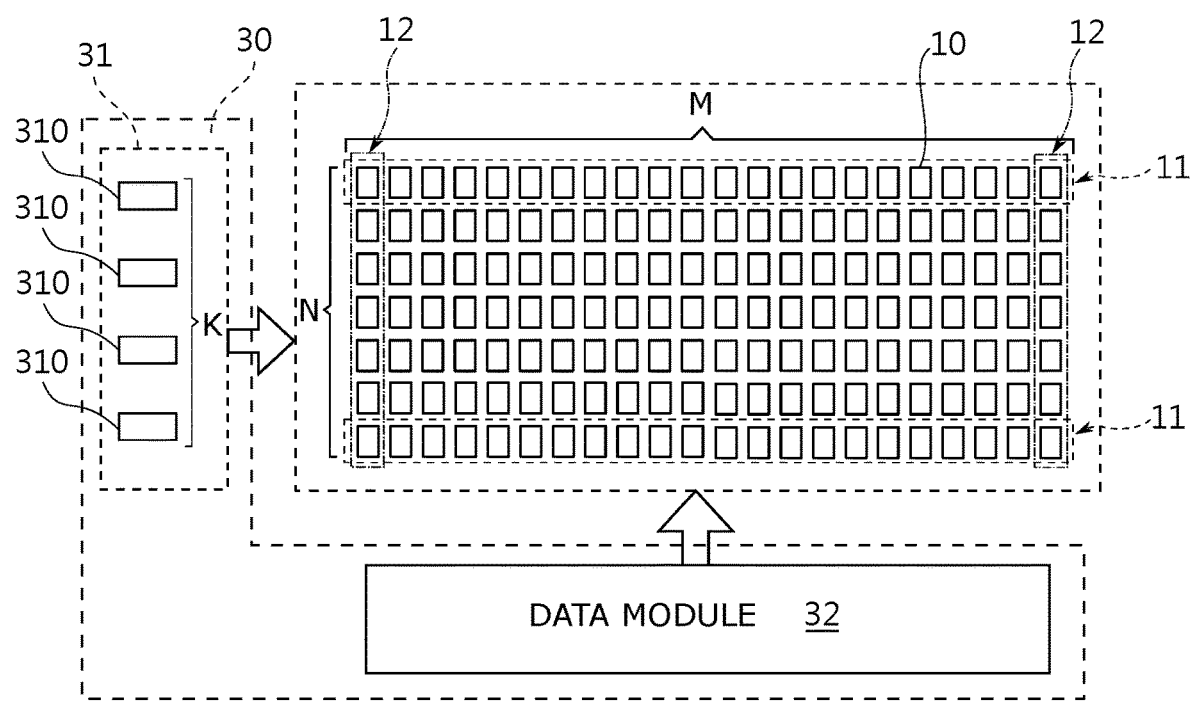
FIG. 3 is a schematic structural view of a second embodiment of a micro-LED display device in accordance with the present invention.

With reference to FIGS. 3 and 2A, the second embodiment of a micro-LED display device of the present invention is shown and is similar to the first embodiment of FIG. 1. In the present embodiment, the micro-LED display device has a plurality of pixel areas 10 and a driving circuit 30. The driving circuit 30 has a scan module 31 and a data module 32. The scan module 31 further has K scan units 310. The K scan units 310 are respectively and electrically connected to the K scan lines 311 of each pixel area 10 of each row of pixel areas 11. For example, the first scan unit 310 is electrically connected to the first scan lines 311 of the pixel areas 10, the second scan unit 310 is electrically connected to the second scan lines 311 of the pixel areas 10, and the Kth scan unit 310 is electrically connected to the Kth scan lines 311 of the pixel areas 10. In the present embodiment, the K scan units 310 may synchronously operate. In a second driving mode of the driving circuit 30, when the K scan units 310 synchronously operate according to a common clock signal, the K scanning signals are synchronously outputted to the K scan lines 311 of the K sub-pixel areas 20 of each pixel area 10 to increase the brightness by K times. In the first driving mode, the K scan units 310 output the K scanning signals in different times to increase a resolution of an image displayed by the micro-LED display device of the present invention.

Figure 4A:
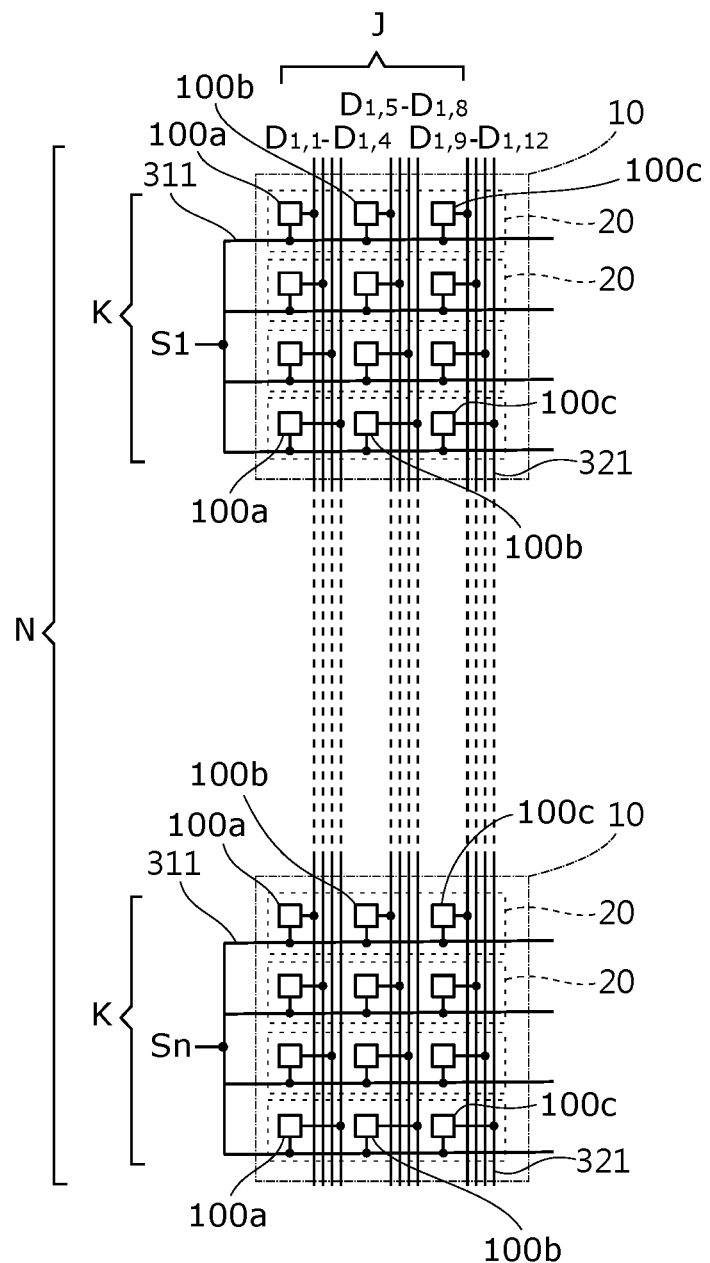
FIG. 4A is another schematic circuit diagram of a single pixel area of the micro-LED display device in accordance with the present invention.

With reference to FIG. 4A, a second embodiment of each pixel area 10 of the present invention. The pixel area 10 has K sub-pixel areas 20 and each sub-pixel area 20 has J micro-LEDs 100a, 100b, 100c with different colored lights. Compared with the pixel area 10 of FIG. 2A, in the present embodiment, all the pixel areas 10 on the same row of pixel areas 11 are commonly and electrically connected to one scan line 311 and all pixel areas 10 on the same column of pixel areas 12 are electrically connected to J*K data lines 321. That is, all the micro-LEDs 100a, 100b, 100c of each pixel area 10 are commonly and electrically connected to one scan line 311, but respectively and electrically connected to K*J data lines 321. Particularly, the micro-LEDs 100a, 100b, 100c of each sub-pixel area 12 may be red, green and blue light-emitting elements. Therefore, each row of pixel areas 11 of the present embodiment has one scan line 311 and each column of pixel areas 12 has twelve data lines 321.

Figure 4B:
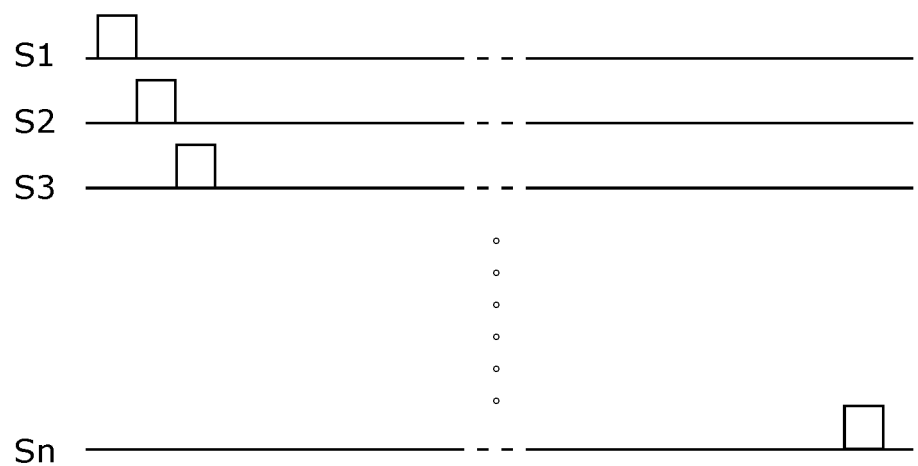
FIG. 4B is a time sequence diagram of a plurality scanning signals of FIG. 4A in a first driving mode.

In the first driving mode of the present embodiment, with further reference to FIG. 4B, the scan module 31 outputs the N scanning signals S1, S2, S3 . . . Sn in sequence to the N scan lines 311 of the N rows of pixel areas 11. When the driving circuit 30 enables one of the N rows of pixel areas 11, the scan module 31 outputs the scanning signal to the corresponding scan line 311 thereof to enable the K sub-pixel areas 20 of each pixel area 10 on the row of pixel areas 11. At the time, the data module 322 selects the J data lines (J=3 in the present embodiment) of at least one sub-pixel area 20 and outputs an image data signal to the selected J data lines. When the at least one sub-pixel area 20 of the enabled pixel area 10 receives the image data signal, the sub-pixel area 29 displays an image color corresponding to the image data signal. Therefore, the image with N*M image pixels is displayed in one frame period. To further increase a resolution of the displayed image, the micro-LED display device may have (N*K)*M sub-pixel areas 20. During the pixel area 10 is enabled, the data module 32 respectively outputs the K image data signals to the K sub-pixel areas 20 of the enabled pixel area 10, and the K sub-pixel areas 20 respectively display different image colors.

In the second driving mode of the present embodiment, when the driving circuit 30 enables one of the rows of pixel areas 11, with reference to FIG. 4B, the scanning signal S1, S2, S3 . . . or Sn is outputted to the single scan line 311 of the row of pixel areas 11 to enable the K sub-pixel areas 20 of each pixel areas 10 on the row of pixel areas 11. The data module 32 respectively outputs the same K image data signals to the K enabled sub-pixel areas 20, so the K enabled sub-pixel areas 20 display the same image colors corresponding to the received image data signals to increase a brightness of the micro-LED display device by K times. That is, the data lines $D_{1,1}$ to $D_{1,4}$ receive the same controlling signals from the data module 32, the data lines $D_{1,5}$ to $D_{1,8}$ receive the controlling signals from the data module 32, and the data lines $D_{1,9}$ to $D_{1,12}$ receive the controlling signals from the data module 32. Therefore, each sub-pixel area 20 is used as one image pixel of the displayed image.

With reference to FIGS. 2A and 4A, in the first driving mode, the driving circuit 30 sequentially enables the N rows of pixel areas 11. When one of the rows of pixel areas 11 is enabled, one sub-pixel area 20 of each pixel area 10 on the row of pixel areas 11 is driven to display the image color used as one image pixel. In the second driving mode, the driving circuit 30 sequentially enables the N rows of pixel areas 11. When one of the rows of pixel areas 11 is enabled, the K sub-pixel areas 20 of each pixel area 10 on the row of pixel areas 11 are synchronously enabled and receive the same image data signals, so the K sub-pixel areas 20 of each pixel area 10 on the row of pixel areas 11 are synchronously driven to display the same image colors used as one image pixel. Therefore, in the second driving mode, the brightness of the micro-LED display device of the present invention is greatly increased to meet the high brightness of image requirement without increasing the conduction currents and the overall power consumption is not increased.

Figure 5:
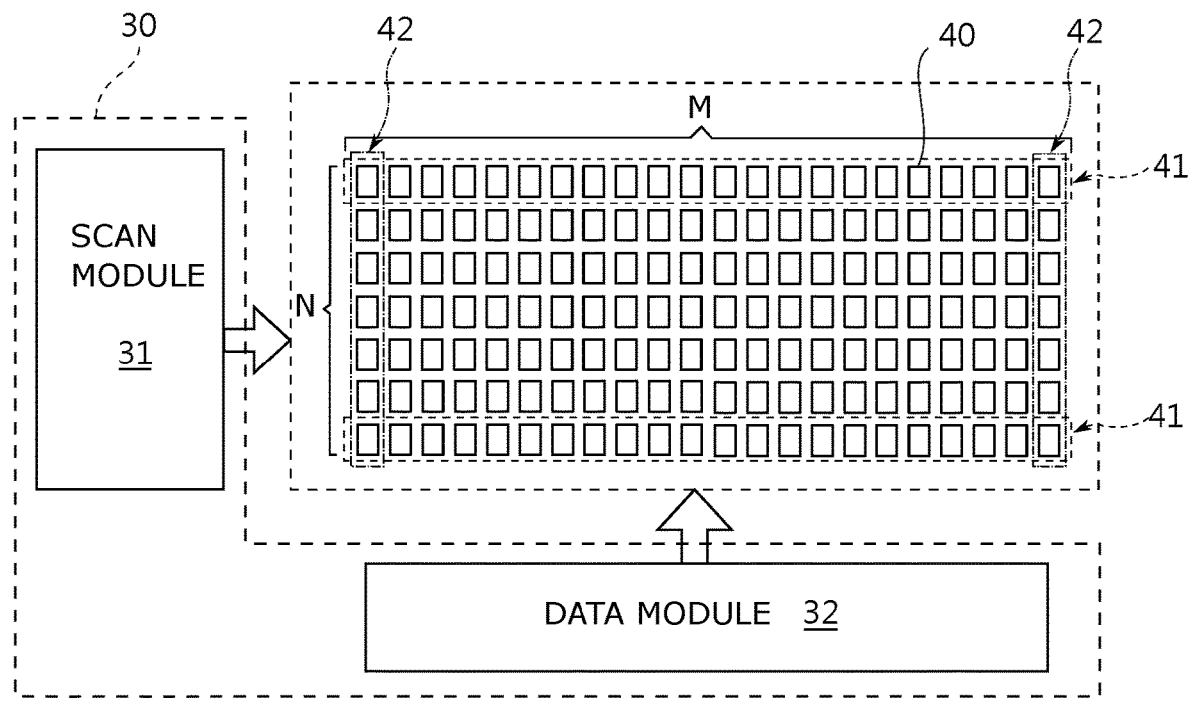
FIG. 5 is a schematic structural view of a third embodiment of a micro-LED display device in accordance with the present invention.
Figure 6A:
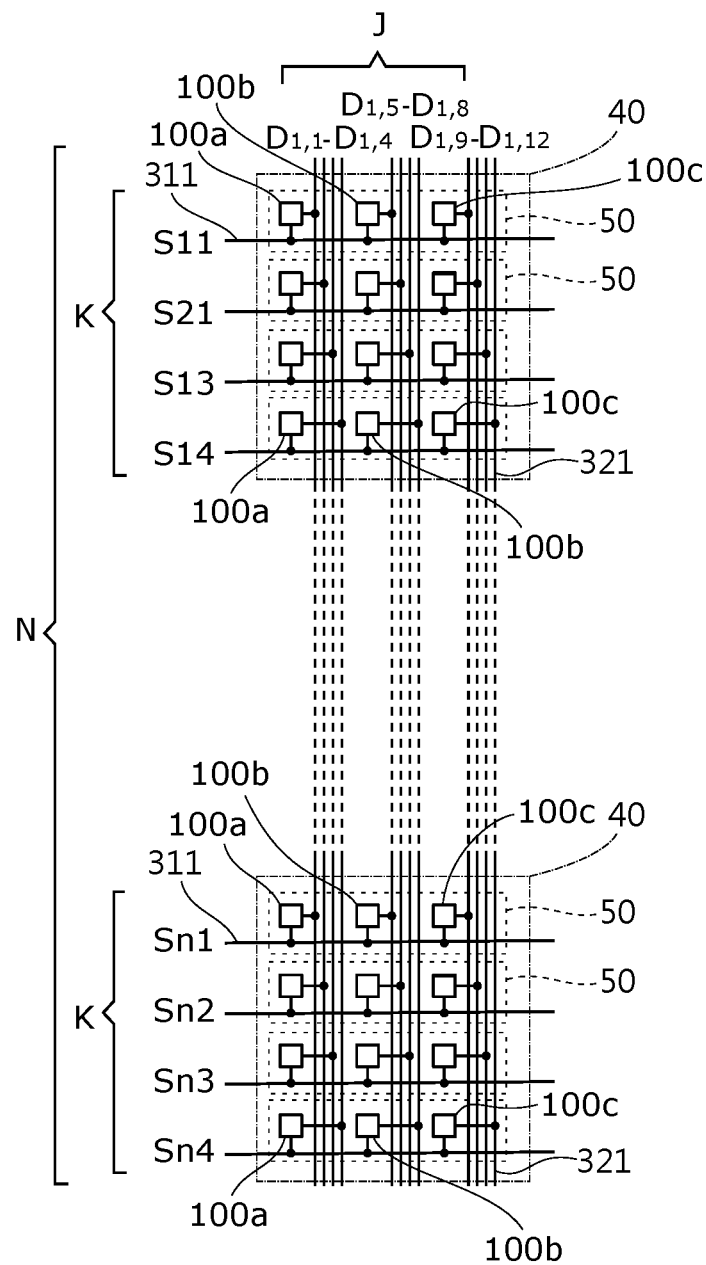
FIG. 6A is a schematic circuit diagram of one pixel group of the micro-LED display device in accordance with the present invention.

With reference to FIGS. 5 and 6A, a third embodiment of a micro-LED display device of the present invention is shown. The micro-LED display device has a plurality of pixel groups 40 and a driving and driving circuit 30. The driving circuit 30 is electrically connected to the pixel groups 40 to drive the pixel groups 40.

The pixel groups 40 are arranged in a N*M matrix to constitute N rows of pixel groups 41 and M columns of pixel groups 42. Each pixel group 40 has K pixel areas 50 arranged adjacent to each other. Each pixel area 50 has J micro-LEDs with different colored lights for displaying different image colors, wherein J=3. Therefore, the pixel groups 40 arranged in a N*M matrix also constitutes N*K rows of pixel areas 50. In one embodiment, a pitch between two adjacent pixel areas 50 is less than 100 μm and a size of each micro-LED 100a, 100b, 100c is less than 30 μm. With further reference to FIG. 6A, in the present embodiment, each pixel group 40 has four pixel areas 50 (K=4). The K pixel areas 50 are respectively and electrically connected to K scan lines 311. The micro-LEDs with the same colored light of each pixel group 40 are commonly and electrically connected to one data line 321. In particular, each pixel area 50 at least has a red micro-LED 100*a*, a green micro-LED 100*b* and blue micro-LED 100*c*. Therefore, in the present embodiment, each row of pixel groups 41 has the four scan lines 311 and twelve data lines 321 of each column of pixel groups 42.

The driving circuit 30 has a scan module 31 and a data module 32. With further reference to FIG. 6A, the scan module 31 is electrically connected to the K scan lines 311 of each row of pixel areas 41, and the data module 32 is electrically connected to twelve scan lines 321 of each column of pixel groups 42. The driving circuit 30 has a first driving mode and a second driving mode.

Figure 6B:
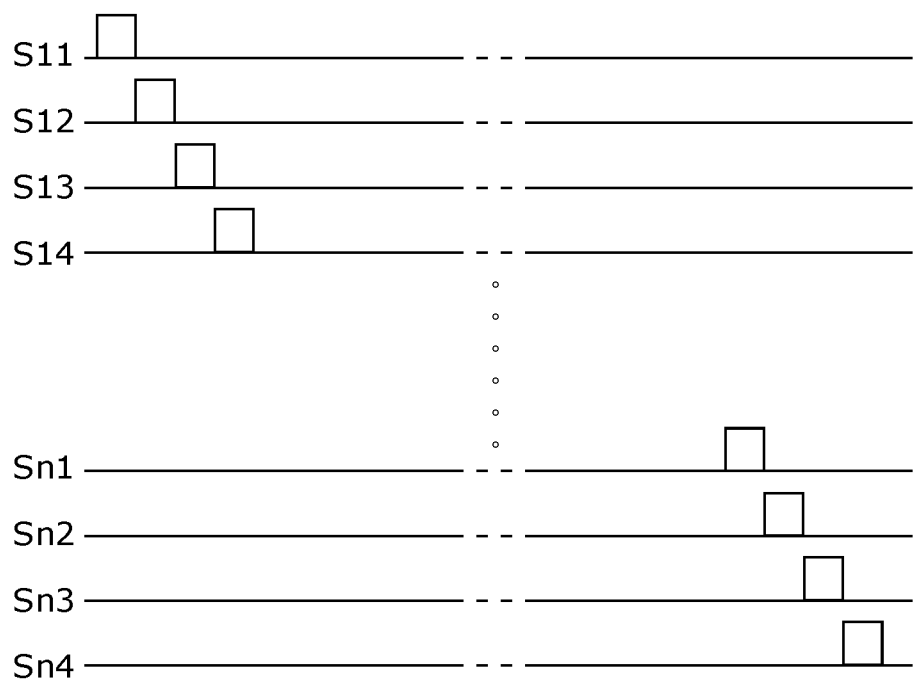
FIG. 6B is a time sequence diagram of a plurality scanning signals of FIG. 6A in a first driving mode.

In the first driving mode, with further reference to FIG. 6B, the driving circuit 30 sequentially outputs N*K scanning signals S11 to Sn4 to the N*K rows of pixel areas 50 in one frame period through the scan module 31 to sequentially enable the N*K rows of pixel areas 50. The data module 32 outputs an image data signal to each enabled pixel area 50 and the enable pixel area 50 displays an image color corresponding the image data signal.

Figure 6C:
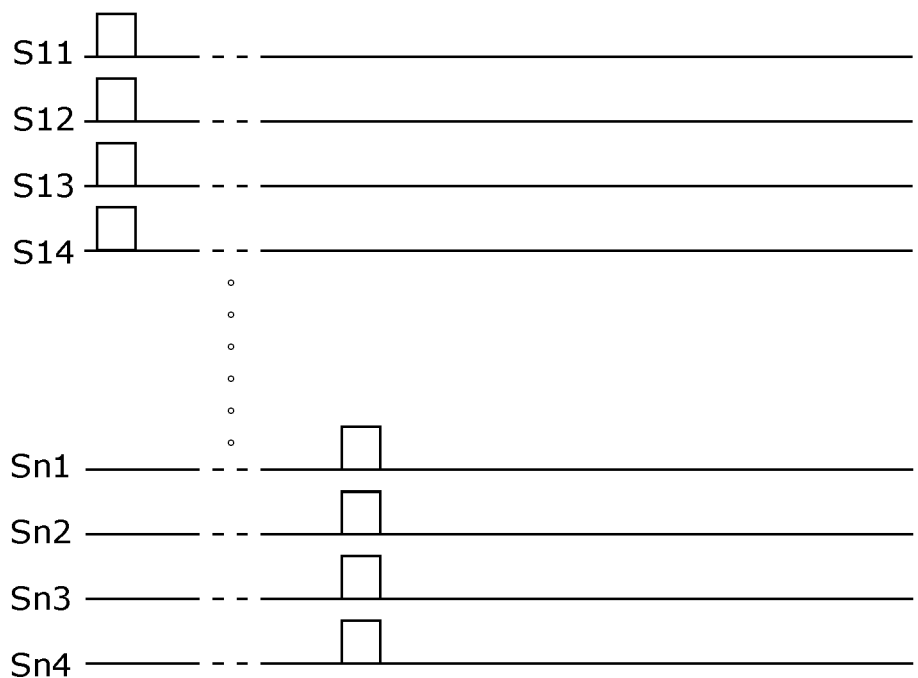
FIG. 6C is a time sequence diagram of a plurality scanning signals of FIG. 6A in a second driving mode.

In the second mode, during one frame period, the driving circuit 30 sequentially enables the N rows of pixel groups 41. When one of the rows of pixel group 41 is enabled, with further reference to FIG. 6C, the K scan signal S11 to S14 are synchronously outputted to the K pixel areas 50, and the image data signal is outputted to the enabled K pixel areas 50. Therefore, the K pixel areas 50 of each enabled pixel group 40 receive the same image data signal to display the same image colors. Compared with the image displayed in the first driving mode, the resolution of the displayed image in the second driving mode decreases, but a brightness is relatively increased and meets the high-brightness requirement. In addition, the frame period of the second driving mode is shorter than that of the first driving mode, since the K scanning signals are synchronously outputted to the K pixel area 50 in the second driving mode, but the K scanning signals are respectively outputted to the K pixel area 50 at different times in the first driving mode. Therefore, a frame rate of the second driving mode is increased. In the present embodiment, the resolution of the image displayed in the first driving mode is higher than that of the second driving mode, but the brightness of displaying the image in the first driving mode is lower than that of the second driving mode.

In the first and second driving modes, the image data signal outputted from the data module 32 has at least three (j=3) constant-current signals or three variable current signals in one pixel area 50. When the enabled pixel area 50 receives the image data signal, the at least three micro-LED 100*a*, 100*b*, 100*c* with different colored lights respectively emits the preset grayscale colors and the three grayscale colors are mixed to the image color corresponding the image data signal.

Based on the foregoing description, in the first and second embodiments of the present invention, each pixel area has K parallel sub-pixel areas. To increase the brightness of displaying image, the K sub-pixel areas are driven to display the same image colors in the second driving mode. In the third embodiment of the present invention, the adjacent pixel areas are divided to a pixel group. In the second driving mode, all pixel areas of each pixel group are driven to display the same image colors. Compared with the first driving mode, the pixel areas are driven to display different image colors, so the brightness of displaying the image in the second driving mode is greatly increased to meet the high-brightness requirement.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A micro-LED display device, comprising:
    a plurality of pixel areas arranged in N*M matrix to constitute N rows of pixel areas and M columns of pixel areas, wherein each pixel area has K sub-pixel areas arranged adjacent to each other and each sub-pixel area has J micro-LEDs with different colored lights; and
    a driving circuit electrically connected to each pixel areas and having a first driving mode and a second driving mode, wherein
    in the first driving mode, the driving circuit sequentially enables the N rows of pixel areas, and when one of the rows of pixel areas is enabled, the at least one sub-pixel area of each pixel area on the enabled row of pixel areas is driven to display an image color; and
    in the second driving mode, the driving circuit sequentially enables the N rows of pixel areas, and when one of the rows of pixel areas is enabled, the K sub-pixel areas of each pixel area on the enabled row of pixel areas are driven to display the same image colors.

2. The micro-LED display device as claimed in claim 1, wherein
    the K sub-pixel areas of each pixel area on each row of pixel areas are respectively and electrically connected to K scan lines;
    J data lines are respectively and electrically connected to the sub-pixel areas of each pixel area on each column of pixel areas, wherein the K micro-LEDs with the same colored lights of each pixel area on each column of pixel areas are commonly and electrically connected to the corresponding data line; and
    the driving circuit has a scan module and a data module, wherein
    in the first driving mode, when the driving circuit enables one of the rows of pixel areas, a scanning signal is outputted to one of the sub-pixel area of each pixel area on the enabled row of pixel areas through the scan module, and an image data signal is outputted to the enabled one of the sub-pixel area through the data module to display the image color corresponding to the image data signal; and
    in the second driving mode, when the driving circuit enables one of the rows of pixel areas, the K scanning signals are synchronously outputted to the K sub-pixel areas of each pixel area on the enabled row of pixel areas through the scan module, and the image data signal is outputted to the enabled K sub-pixel areas through the data module to display the same image colors corresponding to the image data signal.

3. The micro-LED display device as claimed in claim 2, wherein in the first driving mode, when the driving circuit enables one of the rows of pixel areas, the scan module sequentially outputted K scanning signals to the K scan lines at different times to sequentially enable the K sub-pixel areas of each pixel area on the enabled row of pixel areas, and the data module outputs the image data signal to the enabled sub-pixel area to display the image color corresponding to the image data signal.

4. The micro-LED display device as claimed in claim 2, wherein the scan module further has K scan units, and the K scan units are respectively and electrically connected to the K scan lines of each pixel area of the N rows of pixel areas.

5. The micro-LED display device as claimed in claim 2, wherein the scan module has K scan units respectively and electrically connected to the K scan line of the N rows of pixel areas, wherein
in the first driving mode, the K scan units output the K scanning signals at different times; and
in the second driving mode, the K scan units synchronously output the K scanning signals.

6. The micro-LED display device as claimed in claim 2, wherein
a signal scan line is electrically connected to the K sub-pixel areas of each pixel area on each row of pixel areas;
J*K data lines are respectively and electrically connected to the J*K micro-LEDs of each pixel area on each column of pixel areas; and
the driving circuit has a scan module and a data module, wherein
in the first driving mode, when the driving circuit enables one of the rows of pixel areas, a scanning signal is outputted to the signal scan line of the enabled row of pixel areas through the scan module, and the data module selects the J data lines of at least one sub-pixel area of each pixel area of the enabled row of pixel areas and outputs the image data signal thereto to display the image color corresponding to the image data signal; and
in the second driving mode, when the driving circuit enables one of the rows of pixel areas, the scanning signal is outputted to the row of pixel areas through the single scan line through the scan module, and the data module outputs the image data signal to the enabled K sub-pixel areas to display the same image colors corresponding to the image data signal.

7. The micro-LED display device as claimed in claim 1, wherein each micro-LED is electrically connected to a system power, the corresponding scanning line and the corresponding data line through a pixel driving circuit, wherein a first electrode of the micro-LED is electrically connected to a first voltage terminal and a second electrode of the micro-LED is electrically connected to a second voltage terminal.

8. The micro-LED display device as claimed in claim 1, wherein a first image displayed in the first driving mode has a first brightness and a second image displayed in the second driving mode has a second brightness, wherein the first brightness is less than the second brightness.

9. The micro-LED display device as claimed in claim 1, wherein a pitch between the adjacent pixel areas is less than 100 μm and a size of each micro-LED is less than 30 μm.

10. A micro-LED display device, comprising:
a plurality of pixel groups arranged in N*M matrix to constitute N rows of pixel groups and M columns of pixel groups, wherein each pixel group has K pixel areas arranged adjacent to each other and each pixel area has J micro-LEDs with different colored lights; and
a driving circuit electrically connected to each pixel group and having a first driving mode and a second driving mode, wherein
in the first driving mode, the driving circuit sequentially outputs N*K scanning signals to N*K rows of pixel pixels to sequentially enable the N*K rows of pixel areas, and outputs an image data signal to each enabled pixel area to display an image color; and
in the second driving mode, the driving circuit sequentially enables the N rows of pixel groups, and when one of the rows of pixel groups is enabled, the image signal is outputted to the K pixel areas of each pixel group on the enabled row of pixel groups to display the same image colors.

11. The micro-LED display device as claimed in claim 10, wherein
the K pixel areas of each pixel area on each row of pixel groups are respectively and electrically connected to K scan lines;
J*K data lines are respectively and electrically connected to the J*K micro-LEDs on each column of pixel groups; and
the driving circuit has a scan module and a data module, wherein
in the first driving mode, when the driving circuit enables one of the rows of pixel groups, the scanning signals are sequentially outputted to the K pixel areas of each pixel group on the enabled row of pixel groups through the scan module, and an image data signal is outputted to the enabled pixel area through the data module to display the image color corresponding to the image data signal; and
in the second driving mode, when the driving circuit enables one of the rows of pixel groups, the scanning signal is outputted to the row of pixel groups through the single scan line, and the data module outputs the image data signals to the enabled K pixel areas to display the same image colors corresponding to the image data signal.

12. The micro-LED display device as claimed in claim 10, wherein a first image displayed in the first driving mode has a first resolution and a first brightness, and a second image displayed in the second driving mode has a second resolution and a second brightness, wherein the first brightness is less than the second brightness, and the first resolution is larger than the second resolution.

* * * * *